United States Patent
Huang et al.

(10) Patent No.: US 6,852,637 B2
(45) Date of Patent: Feb. 8, 2005

(54) METHOD OF ETCHING A MASK LAYER AND A PROTECTING LAYER FOR METAL CONTACT WINDOWS

(75) Inventors: Tsai-Yu Huang, Hsinchu Hsien (TW); Raymond Wang, Taipei (TW); Sheng-chuan Su, Hsinchu (TW)

(73) Assignee: Nanya Technology Corporation, Taoyuan (TW)

( * ) Notice: Subject to any disclaimer, the term of this patent is extended or adjusted under 35 U.S.C. 154(b) by 85 days.

(21) Appl. No.: 10/053,160

(22) Filed: Jan. 15, 2002

(65) Prior Publication Data

US 2003/0087526 A1 May 8, 2003

(30) Foreign Application Priority Data

Nov. 6, 2001 (TW) .......................................... 90127509

(51) Int. Cl.⁷ .......................................... H01L 21/302
(52) U.S. Cl. ...................... 438/706; 438/710; 438/712; 438/720; 216/41
(58) Field of Search ................................ 438/706, 710, 438/712, 720, 723, 725; 216/41, 44

(56) References Cited

U.S. PATENT DOCUMENTS

| | | | | |
|---|---|---|---|---|
| 5,972,773 A | * | 10/1999 | Liu et al. ...................... | 438/424 |
| 5,985,765 A | * | 11/1999 | Hsiao et al. ................ | 438/694 |
| 6,040,211 A | * | 3/2000 | Schrems ..................... | 438/238 |
| 6,207,583 B1 | * | 3/2001 | Dunne et al. ............... | 438/725 |
| 6,291,887 B1 | * | 9/2001 | Wang et al. ................. | 257/758 |
| 6,316,169 B1 | * | 11/2001 | Vahedi et al. ............... | 430/329 |

* cited by examiner

Primary Examiner—Lan Vinh
(74) Attorney, Agent, or Firm—Ladas & Parry

(57) ABSTRACT

A method of etching a mask layer as a protecting layer for metal contact windows uses a victim layer with slopes to avoid undercutting. First, a mask layer is formed on a semiconductor substrate. Next, a photoresist with patterns is formed on the surface of the mask layer. Next, a victim layer is formed on the surface of the photoresist according to the photoresist topography, such that a plurality of slopes is formed on the sidewalls of the photoresist. The photoresist and the victim layer with slopes are used as the etching mask to etch the mask layer to form patterns.

9 Claims, 4 Drawing Sheets

METHOD OF ETCHING A MASK LAYER AND A PROTECTING LAYER FOR METAL CONTACT WINDOWS

BACKGROUND OF THE INVENTION

1. Field of the Invention

The present invention relates in general to an etching method, and particularly to a method of etching a mask layer and protecting layer for metal contacting window.

2. Description of the Related Art

With the technology of integrated circuits evolving, device sizes have reached sub-micron, half-micron, deep sub-micron and very deep sub-micron levels. Because of reduced device size, there can be more IC devices in one chip. It also means that chips have better performance. Therefore, etching technology plays a very important role. Desired circuit patterns being presented accurately depends on etching technology. High density plasma (HDP) etching technology has been widely applied in etching silicon dioxide layer, silicon nitride layer, polysilicon layer and metal layer.

The prior art utilizing high density plasma to etch a thin film is shown in FIGS. 1A–1C. In FIG. 1A, a silicon oxide layer 12 and a thin film, such as polysilicon layer 14, are formed on a silicon substrate 10 in sequence. The thin film is designed in a pattern on the surface for the following etching. Then, a photoresist layer 16 is coated on the polysilicon 14 and defines the pattern through photolithography, as shown in FIG. 1B. The polysilicon 14 undergoes high density plasma etching to form a pattern 18 using the photoresist layer with the defined patterns, as shown in FIG. 1C. After etching, the developed photoresist 16 is removed. High density plasma etching is dry etching. Vertical side-walls are obtained by this technology because a protecting film (not shown) is formed on the side-walls of polysilicon during dry etching, such that the etching is anisotropic. Forming the protecting film depends strongly on the reaction gases, the etched material and the photoresist. If any of the factors is incomplete, the etching is isotropic.

However, in order to obtain patterns with higher resolution, a thin photoresist layer is required. Etching selectivity between a thin photoresist layer and an etched material is not good enough, however, with the result that the surface of the etched photoresist is not flat, as shown in FIG. 1C. Therefore, hard mask use in etching has been developed, as shown in FIGS. 2A–2E. In FIG. 2A, a silicon dioxide layer 21 and a polysilicon layer 22 are formed on a silicon substrate 20 in sequence. In 2B, a silicon dioxide layer 23 (or a silicon nitride) is formed on the polysilicon 22. A photoresist layer 24 is spin-coated over the silicon dioxide layer 23. After coating, photolithography is performed and the resulting structure is shown in FIG. 2C. Then, the silicon dioxide layer 23 is etched to form a hard mask 25 using the pattern defined photoresist 24 to be the mask. The photoresist 24 is removed, as shown in FIG. 2D. Finally, high density plasma etching is performed on the polysilicon layer 22 to form patterns 26 using the hard mask 25. However, because the protecting film cannot be formed, this etching results in an undercutting, as shown in FIG. 2E. The desired circuit can't be presented exactly.

SUMMARY OF THE INVENTION

The object of the present invention is a method of etching a mask layer to act as a protecting layer for metal contact windows using a victim layer with slopes to avoid undercutting.

According to the present invention, a method for solving the undercutting on the sidewalls of the etched layer includes the following steps. First, a mask layer is formed on a semiconductor substrate. Next, a photoresist with patterns is formed on the surface of the mask layer. Next, a victim layer is formed on the surface of the photoresist according to the photoresist topography, wherein the thickness of the victim layer is less than that of the photoresist, such that a plurality of slopes are formed on the sidewalls of the photoresist. Then, the photoresist and the victim layer with slopes are used as the etching mask for etching the mask layer to form patterns.

With the above flow, the desired circuit patterns can be presented accurately after solving the undercutting.

BRIEF DESCRIPTION OF THE DRAWINGS

The present invention will become more fully understood from the detailed description given herein below and the accompanying drawings, given by way of illustration only and thus not intended to be limitative of the present invention.

DETAILED DESCRIPTION OF THE PREFERRED EMBODIMENT

In FIG. 3, a silicon substrate 30 is provided. A semiconductor device and inner leads are formed on the silicon substrate 30 (not shown). A protecting layer 31, such as nitride, is formed on the inner leads by the prior art of depositing thin film technology to protect from moisture, metal ions attacking and mechanical scrape. The prior art of depositing thin film technology is chemical vapor deposition (CVD), such as plasma enhanced CVD, low pressure CVD or atmospheric CVD. After forming a protecting layer 31, a photoresist layer 32 is spin-coated on the protecting layer 31.

Figure 1A:
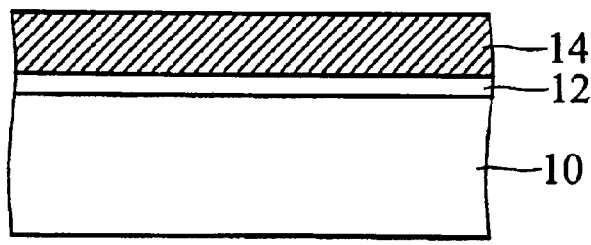
FIGS. 1A–1C are sectional diagrams showing high density etching according to the prior art.
Figure 1B:
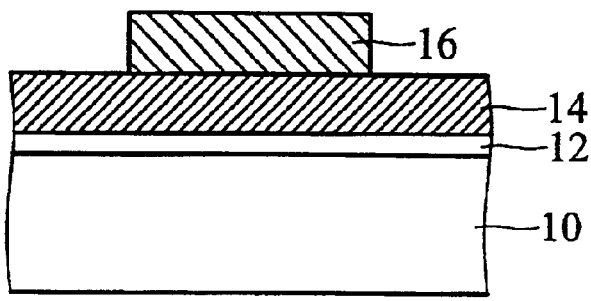
Figure 1C:
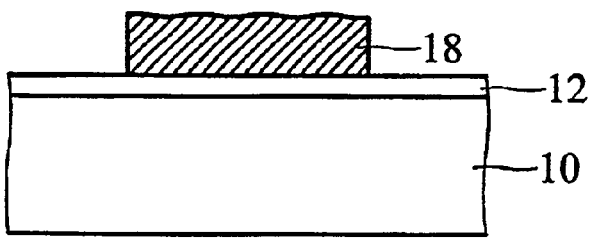
Figure 2A:
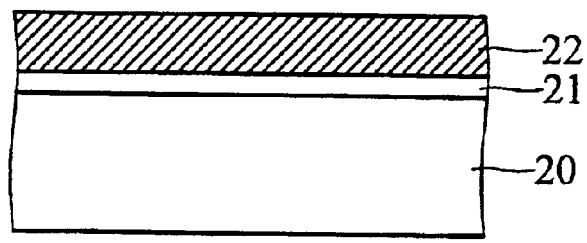
FIGS. 2A–2E are sectional diagrams showing an etching using a hard mask according to the prior art.
Figure 2B:
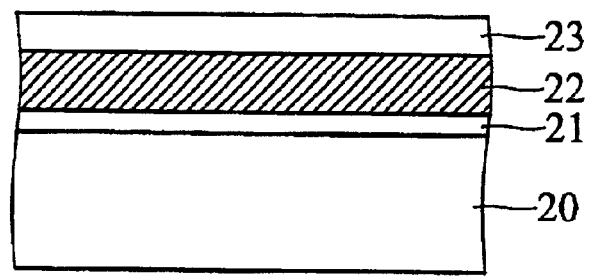
Figure 2C:
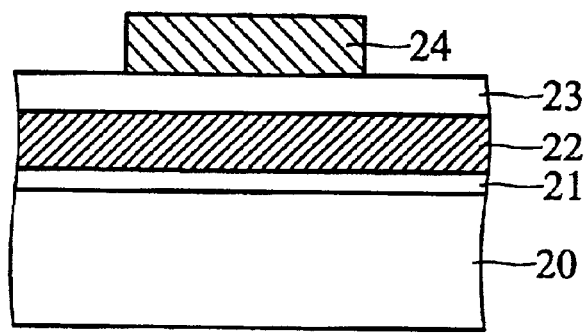
Figure 2D:
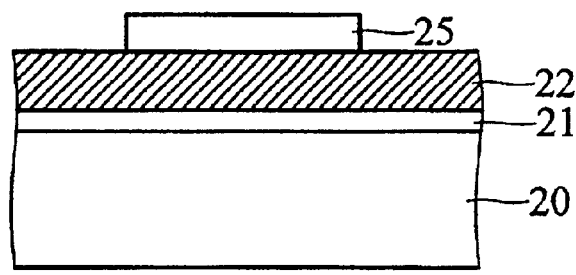
Figure 2E:
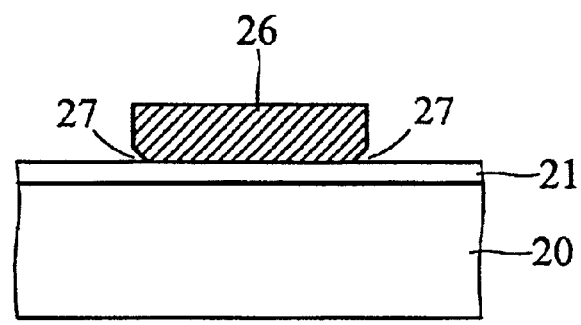
Figure 3A:
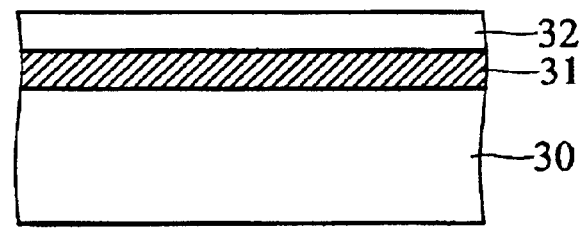
FIGS. 3A–3D are sectional diagrams showing an etching of a preferred embodiment according to the present invention.
Figure 3B:
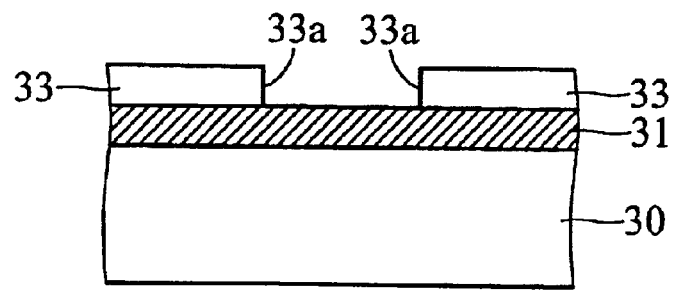
Figure 3C:
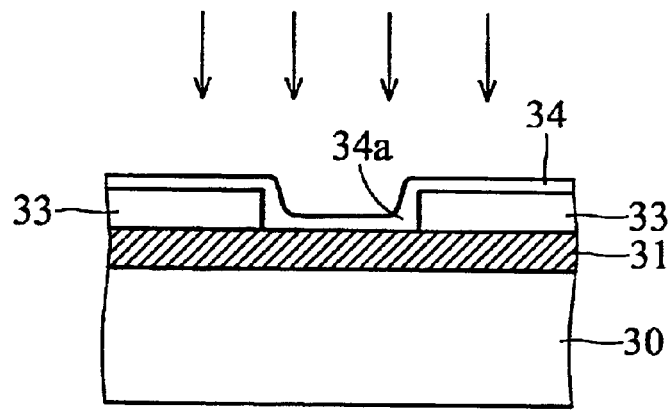

In FIG. 3B, patterns 33 are defined and formed on the photoresist layer 32 through photolithography. Next, a victim layer 34 is formed on the surface of the patterns 33 according to the pattern topography, as shown in FIG. 3C. The victim layer 34 material is an anti-reflection coating. Additionally, the thickness of the victim layer 34, less than the photoresist 33, is about 800~1000 Å. The optimum thickness is 900 Å. The contour of the victim layer 34 contains slopes 34a on photoresist sidewalls 33a.

Figure 3D:
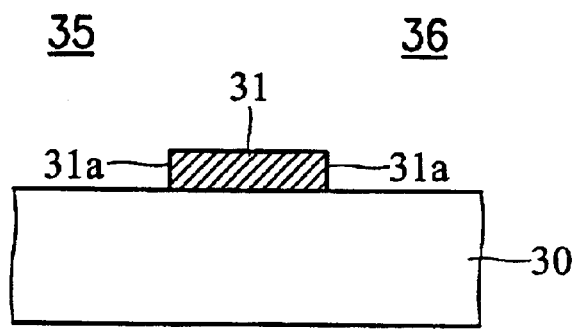

Then, etching is performed on the protecting layer 31, and both the photoresist 32 and the victim layer 34 are used as the mask. As a result, pad regions 35 and fuse regions 36 are defined and formed a plurality of metal contacting windows. According to the present invention, there is no undercut on the sidewalls 31a of the protecting layer after etching, as shown in FIG. 3D. The circuit patterns are defined and developed precisely.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for etching a mask layer, comprising steps of:

forming, a mask layer on a semiconductor substrate;

forming a photoresist with patterns on the surface of the mask layer;

forming a victim layer comprised of an anti-reflection coating layer on the surface of the photoresist according to the photoresist topography, wherein the thickness of the victim layer is smaller than that of the photoresist, such that a plurality of slopes are formed on the sidewalls of the photoresist; and etching the mask layer using the photoresist and the victim layer with the slopes to be the etching mask.

2. The method for etching a mask layer as claimed in claim 1, wherein the mask layer is a nitride.

3. The method for etching mask layer as claimed in claim 1, wherein the thickness of the victim layer is 800~1000 Å.

4. The method for etching a mask layer as claimed in claim 1, wherein the victim layer is formed on both the mask layer and the surface of the photoresist.

5. A method for etching a protecting layer for metal contact windows, comprising steps of:

providing a semiconductor with semiconductor elements or inner leads on the surface;

forming a protecting layer over the inner leads forming a photoresist with patterns on the protecting layer;

forming a victim layer comprised of an anti-reflection coating layer on the surface of the photoresist according to the photoresist topography, wherein the thickness of the victim layer is smaller than that of the photoresist with patterns, such that a plurality of slopes are formed on the sidewalls of the photoresist; and etching the protecting layer to form a plurality of metal contacting windows using the photoresist and the victim layer with the slopes to be the etching mask.

6. The method for etching a protecting layer for metal contact windows as claimed in claim 5, wherein the protecting layer is nitride.

7. The method for etching a protecting layer for metal contact windows as claimed in claim 5, wherein the thickness of the victim layer is 800~1000 Å.

8. The method for etching a protecting layer for metal contact windows as claimed in claim 5, wherein the plurality of metal contacting windows are pad regions and fuse regions.

9. The method for etching a protecting layer as claimed in claim 5, wherein the victim layer is formed on both the protecting layer and the surface of the photoresist.

* * * * *